United States Patent
Umehara et al.

(10) Patent No.: US 7,229,917 B2
(45) Date of Patent: Jun. 12, 2007

(54) FILM FORMATION METHOD AND APPARATUS FOR SEMICONDUCTOR PROCESS

(75) Inventors: Takahito Umehara, Tokyo (JP); Masahiko Tomita, Tokyo (JP); Hirotake Fujita, Tokyo (JP); Kazuhide Hasebe, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 27 days.

(21) Appl. No.: 10/957,827

(22) Filed: Oct. 5, 2004

(65) Prior Publication Data
US 2005/0176261 A1   Aug. 11, 2005

(30) Foreign Application Priority Data
Oct. 7, 2003   (JP)   ............................. 2003-348869
Sep. 13, 2004  (JP)   ............................. 2004-265205

(51) Int. Cl.
H01L 21/4763   (2006.01)
(52) U.S. Cl. ...................... 438/650; 438/584; 438/686; 257/E21.591
(58) Field of Classification Search ...................... None
See application file for complete search history.

(56) References Cited

U.S. PATENT DOCUMENTS
2001/0006838 A1*   7/2001   Won et al. .................. 438/396
2003/0003730 A1*   1/2003   Li ............................. 438/680

FOREIGN PATENT DOCUMENTS

| JP | 5-251391 | 9/1993 |
|---|---|---|
| JP | 11-354751 | 12/1999 |
| JP | 2001-345285 | 12/2001 |
| JP | 2002-176052 | 6/2002 |
| JP | 2002-280378 | 9/2002 |
| JP | 2003-68676 | 3/2003 |
| JP | 2003-193233 | 7/2003 |
| JP | 2003-209063 | 7/2003 |

* cited by examiner

Primary Examiner—Walter Lindsay, Jr.
Assistant Examiner—Cheung Lee
(74) Attorney, Agent, or Firm—Oblon, Spivak, McClelland, Maier & Neustadt, P.C.

(57) ABSTRACT

A film-formation method for a semiconductor process includes seed film formation and main film formation. In the seed film formation, a metal-containing raw material gas and a first assist gas to react therewith are supplied into a process container, which accommodates a target substrate having an underlying layer, thereby forming a seed film on the underlying layer by CVD. In the main film formation, the raw material gas and a second assist gas to react therewith are supplied into the process container, thereby forming a main film on the seed film by CVD. The seed film formation includes first and second periods performed alternately and continuously. In each first period, the raw material gas is supplied into the process container while the first assist gas is stopped. In each second period, the first assist gas is supplied into the process container while the raw material gas is stopped.

13 Claims, 5 Drawing Sheets

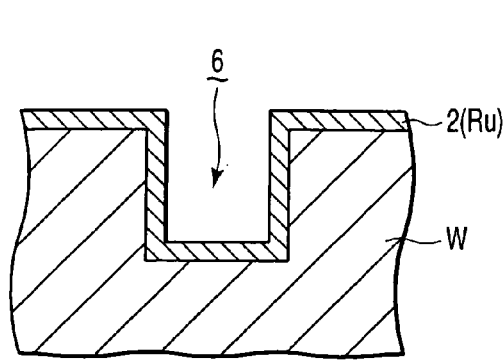
F I G. 2 A
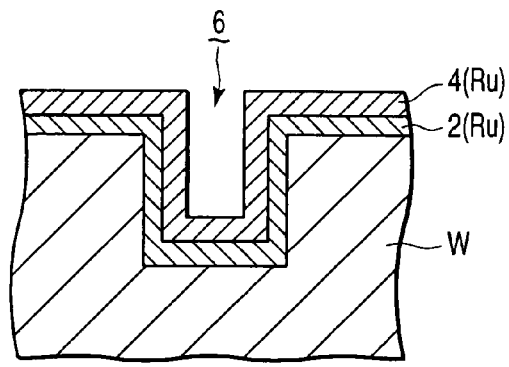
F I G. 2 B
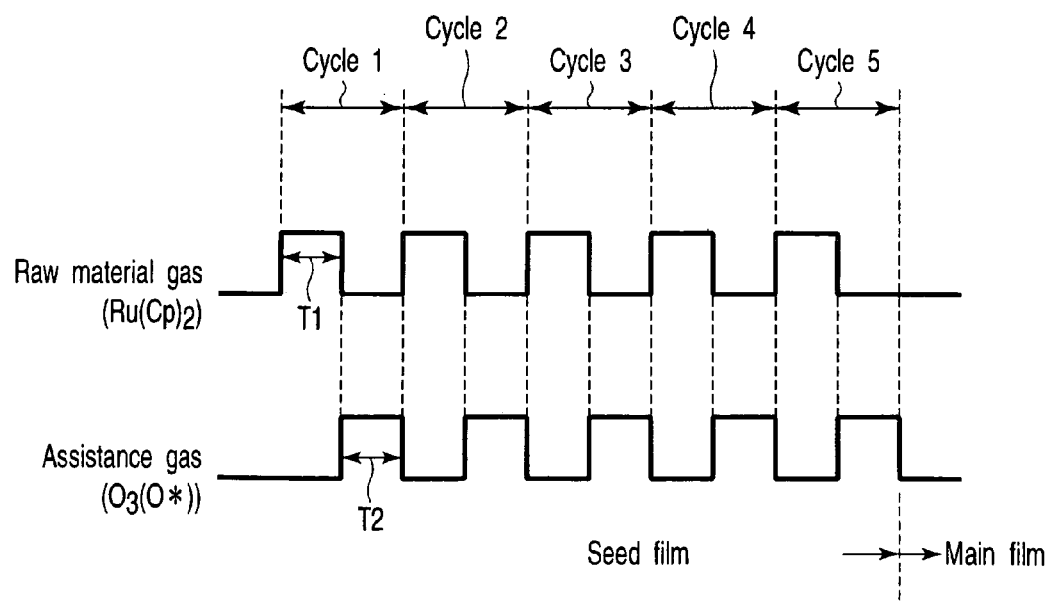
F I G. 3

FILM FORMATION METHOD AND APPARATUS FOR SEMICONDUCTOR PROCESS

CROSS-REFERENCE TO RELATED APPLICATIONS

This application is based upon and claims the benefit of priority from prior Japanese Patent Applications No. 2003-348869, filed Oct. 7, 2003; and No. 2004-265205, filed Sep. 13, 2004, the entire contents of both of which are incorporated herein by reference.

BACKGROUND OF THE INVENTION

1. Field of the Invention

The present invention relates to a film formation method and apparatus for a semiconductor process, which are used for forming a thin film on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer, is subjected to various processes, such as film formation, oxidation, diffusion, reformation, annealing and etching, in general. For example, where a wiring structure is formed, a target substrate is provided with a film of a metal or metal compound thereon, such as W (tungsten), WSi (tungsten silicide), Ti (titanium), TiN (titanium nitride), TiSi (titanium silicide), Cu (copper), $Ta_2O_5$ (tantalum oxide).

In recent years, semiconductor devices have become smaller and more highly integrated, thereby making the design rule on the size of each semiconductor device stricter, i.e., miniaturized. Under the circumstances, capacitors formed of semiconductor devices are therefore required to be further smaller. In this respect, for example, it has been proposed to use a three dimensional device structure, because a larger capacitance can be obtained with the same occupied surface area. Further, in order to increase capacitance, a thin film of a dielectric oxide (a material wit a high dielectric constant), a representative of which is BST (barium strontium titanium oxide), is used as a capacitor insulating film.

It has been studied to use an Ru film (ruthenium film) or $RuO_2$ film (ruthenium oxide film) as a capacitor electrode, so as to reduce the resistance, along with such a capacitor insulating film with a high dielectric constant. Jpn. Pat. Appln. KOKAI Publication Nos. 11-354751, 2001-345285, and 2003-68676 disclose techniques concerning capacitor electrodes of this kind.

FIGS. 7A and 7B are sectional views showing sequential steps of a conventional method for forming an Ru film. Since raw material gases of an Ru film have low surface adsorptivity, it is difficult to directly deposit an Ru film on an underlying layer by CVD (Chemical Vapor Deposition). Accordingly, as shown in FIG. 7A, a seed film 2 of a very thin Ru film is first formed on the underlying layer of a semiconductor wafer W by a sputtering process performed in a sputtering apparatus, which utilizes plasma.

Then, the semiconductor wafer W with the seed film 2 formed thereon is unloaded from the sputtering apparatus and loaded into a CVD apparatus. Then, as shown in FIG. 7B, a CVD process is performed at a high film-formation rate to form a main film 4 of an Ru film over the entire surface of the wafer W including the inner wall of a recess 6. In the CVD process, since the seed film 2 is present below, the Ru film is easily deposited, using the seed film 2 as nuclei. As a consequence, the film is formed on the inner wall of a recess 6 with high step coverage (degree of covering a step portion). This CVD process employs a raw material gases, such as biscyclopentadienyl ruthenium (which may be referred to as $Ru(C_5H_5)_2$ or $Ru(Cp)_2$), and oxygen gas.

BRIEF SUMMARY OF THE INVENTION

An object of the present invention is to provide a film-formation method and film-formation apparatus that can deposit a thin film, without using a sputtering apparatus, even where a raw material gas has low surface adsorptivity.

According to a first aspect of the present invention, there is provided a film-formation method for a semiconductor process, comprising:

supplying a raw material gas containing a metal and a first assist gas to react with the raw material gas into a process container, which accommodates a target substrate having an underlying layer on a surface, thereby forming a seed film on the underlying layer by CVD; and supplying the raw material gas and a second assist gas to react with the raw material gas into the process container, thereby forming a main film on the seed film by CVD, wherein forming the seed film comprises a plurality of first periods and a plurality of second periods performed alternately and continuously, each first period is set to supply the raw material gas into the process container while stopping supply of the first assist gas, and each second period is set to supply the first assist gas into the process container while stopping supply of the raw material gas.

According to a second aspect of the present invention, there is provided a film-formation apparatus for a semiconductor process, comprising:

a reaction container configured to accommodate a target substrate having an underlying layer on a surface;

a heater configured to heat up an interior of the reaction container;

an exhaust section configured to exhaust the interior of the reaction container;

a raw material gas supply circuit configured to supply a raw material gas containing a metal into the reaction container;

a first assist gas supply circuit configured to supply a first assist gas to react with the raw material gas into the reaction container;

a second assist gas supply circuit configured to supply a second assist gas to react with the raw material gas into the reaction container; and a controller configured to control an operation of the apparatus, the controller being arranged to execute supplying the raw material and the first assist gas into the process container, thereby forming a seed film on the underlying layer by CVD; and supplying the raw material gas and the second assist gas into the process container, thereby forming a main film on the seed film by CVD, wherein forming the seed film comprises a plurality of first periods and a plurality of second periods performed alternately and continuously, each first period is set to supply the raw material gas into the process container while stopping supply of the first assist gas, and each second period is set to supply the first assist gas into the process container while stopping supply of the raw material gas.

In the first and second aspects, forming the main film preferably comprises simultaneously supplying the raw material gas and the second assist gas into the process container.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A and 2B are sectional views showing sequential steps of a method for forming an Ru film, according to an embodiment of the present invention;

FIG. 3 is a timing chart showing a manner of supplying gases in the film-formation method described above;

DETAILED DESCRIPTION OF THE INVENTION

Figure 7A:
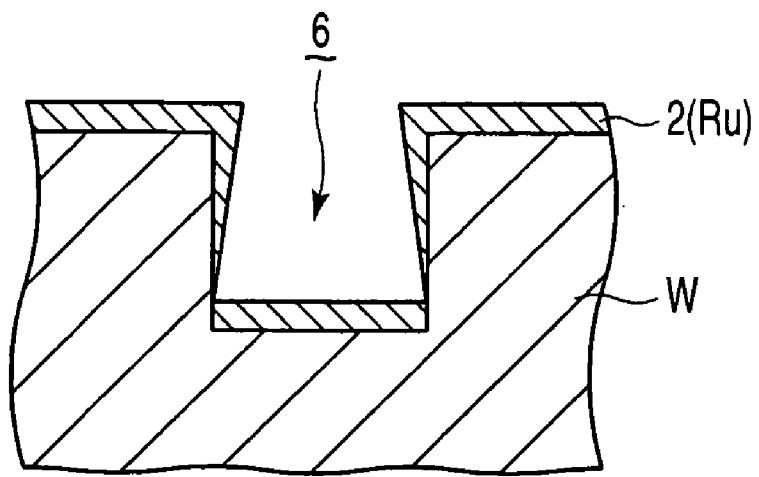
FIGS. 7A and 7B are sectional views showing sequential steps of a conventional method for forming an Ru film.
Figure 7B:
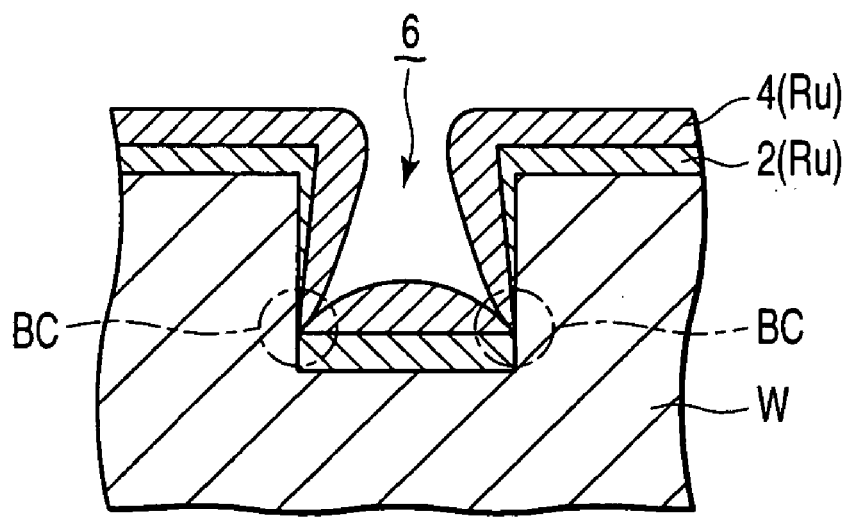

In the process of developing the present invention, the inventor studied problems of the conventional method for forming an Ru film shown in FIGS. 7A and 7B. As a result, the inventor has arrived at the findings given below.

The film-formation method shown in FIGS. 7A and 7B requires two apparatuses, i.e., a sputtering apparatus and a CVD apparatus. In this case, the equipment cost inevitably increases. Further, as sputtering apparatuses have low step coverage, ill effects may be brought about in a subsequent film-formation by CVD. Specifically, sputtering apparatuses cannot form a film over the entire inner wall of the recess 6, and, particularly, deposition of the seed film 2 tends to be locally insufficient at lower side portions BC, as the case may be. Where the seed film 2 is very thin at the lower side portions BC, the main film 4 deposited thereon by CVD also becomes very thin. As a consequence, the underlying layer may be oxidized from the lower side portions BC.

On the other hand, for example, Jpn. Pat. Appln. KOKAI Publication No. 2003-193233 discloses a method for forming a tungsten film. In this method, a raw material gas and oxidizing gas are alternately supplied, and purge periods are interposed between respective supply periods to vacuum-exhaust residual gases. As described later, even if this method is applied to film-formation of an Ru film, it is impossible to form an Ru film usable for actual devices. This is believed to due to the fact that, because of the low surface adsorptivity of $Ru(Cp)_2$ used as a raw material gas, a seed film, which functions as a first foothold on the underlying layer, is not formed.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 1:
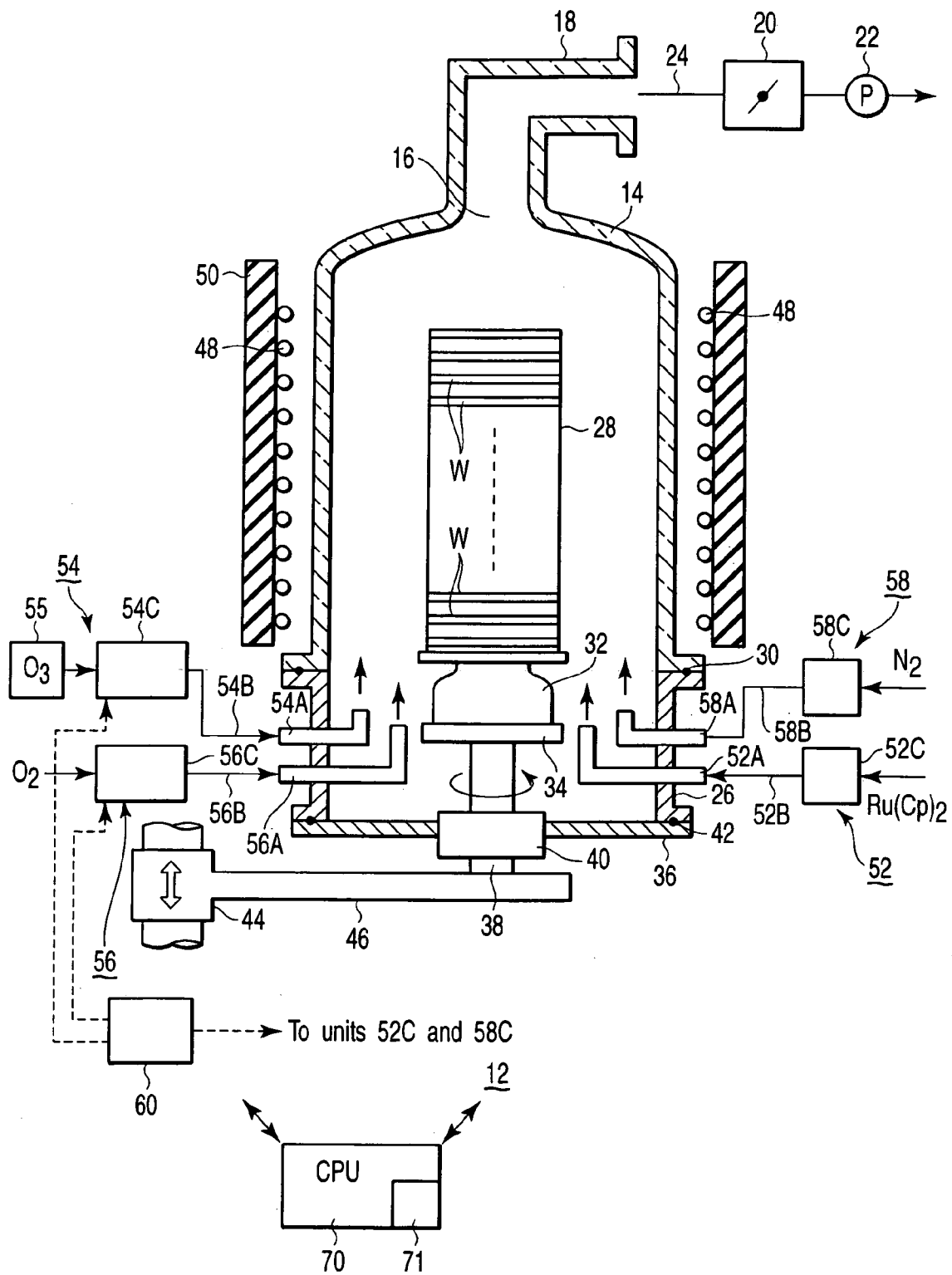
FIG. 1 is a structural view showing a film-formation apparatus according to an embodiment of the present invention.

FIG. 1 is a structural view showing a film-formation apparatus according to an embodiment of the present invention. As shown in FIG. 1, the film-formation apparatus (CVD apparatus) 12 includes a vertical process container 14, which is cylindrical and opened at the bottom. The process container 14 is made of, e.g., quartz, which is high in heat resistance. An exhaust port 16 is formed at the top of the process container 14. The exhaust port 16 is connected to, e.g., an exhaust nozzle 18 laterally bent at right angles. The exhaust nozzle 18 is connected to an system 24 including a pressure control valve 20 and a vacuum pump 22 provided on the way. The interior of the process container 14 is vacuum-exhausted by the exhaust section 24.

The bottom of the process container 14 is supported by a cylindrical manifold 26 made of, e.g., stainless steel. A sealing member 30, such as an O-ring, is interposed between the bottom of the process container 14 and manifold 26 to keep this portion airtight. The manifold 26 has a port at the bottom, through which a wafer boat 28 is loaded and unloaded. The wafer boat 28 is made of quartz, and functions as holding means for holding semiconductor wafers W at intervals in the vertical direction. In this embodiment, the wafer boat 28 can support, e.g., 50 wafers W each having a diameter of 300 mm, essentially at regular intervals in the vertical direction.

The wafer boat 28 is placed on a table 34 through a heat-insulating cylinder 32 made of quartz. The table 34 is supported on the top of a rotary shaft 38, which penetrates a lid 36 used for opening/closing the bottom port of the manifold 26. The portion of the lid 36 where the rotary shaft 38 penetrates is provided with, e.g., a magnetic-fluid seal 40, so that the rotary shaft 38 is rotatably supported in an airtightly sealed state. A seal member 42, such as an O-ring, is interposed between the periphery of the lid 36 and the bottom of the manifold 26, so that the interior of the process chamber 14 can be kept sealed.

The rotary shaft 38 is attached at the distal end of an arm 46 supported by an elevating mechanism 44, such as a boat elevator. The elevating mechanism 44 moves up and down the wafer boat 28 and lid 36 integratedly. The table 34 may be fixed to the lid 36, so that the wafer boat 28 is not rotated in processing wafers W.

A heater 48 formed of carbon wires (for example, see Jpn. Pat. Appln. KOKAI Publication No. 2003-209063) is disposed to surround the process container 14. The heater 48 is arranged to heat the atmosphere within the process container 14 so as to heat up the semiconductor wafers W. The carbon wire heater matches a case where processes are serially performed, as described later, because it can realize a clean process and has a good characteristic in changing the temperature up and down. The heater 48 is surrounded by a thermal insulator 50 to ensure thermal stability. The manifold 26 is connected to several gas supply circuits to supply various gases into the process container 14.

More specifically, the manifold 26 is connected to a raw material gas supply circuit 52, first assist gas supply circuit 54, second assist gas supply circuit 56, and inactive gas supply circuit 58. The raw material gas supply circuit 52 is arranged to supply a raw material gas containing a metal for film-formation into the process container 14. The first assist gas supply circuit 54 is arranged to supply a first assist gas, which reacts with the raw material gas, into the process container 14. The second assist gas supply circuit 56 is arranged to supply a second assist gas, which reacts with the raw material gas, into the process container 14. The inactive gas supply circuit 58 is arranged to supply an inactive gas, such as $N_2$, into the process container 14. In place of $N_2$, Ar or He may be used as the inactive gas.

The gas supply circuits 52, 54, 56, and 58 have gas nozzles 52A, 54A, 56A, and 58A, respectively. Each of the gas nozzles 52A, 54A, 56A, and 58A penetrates the sidewall of the manifold 26 and is bent at right angles to direct the distal end upward. The gas nozzles 52A, 54A, 56A, and 58A are connected to gas lines 52B, 54B, 56B, and 58B provided with gas control units 52C, 54C, 56C, and 58C, respectively, each of which is formed of a flow rate controller, such as a mass flow controller, and a switching valve. The gas control units 52C, 54C, 56C, and 58C are operated by a gas supply controller 60, such as a microcomputer, to control the supply, stop, and flow rates of the gases.

In this embodiment, the raw material gas is $Ru(Cp)_2$, which is an organic material containing Ru. The first assist gas is $O_3$ (ozone) gas, and the second assist gas is $O_2$ gas. The gas line 54B of the first assist gas supply circuit 54 is provided with an ozonizer 55 along its line, to generate the $O_3$ gas containing oxygen radicals.

Next, an explanation will be given of a film-formation method according to an embodiment of the present invention, performed in the film-formation apparatus 12 described above. The method according to this embodiment is characterized in that the raw material gas and first assist gas are supplied at different timings to be alternately and continuously supplied a plurality of times so as to deposit a thin film. Further, subsequently to this step, a film-formation process is serially performed by CVD under different conditions in the same process container 14, as needed.

The method described below (including the supply and stop of the gases) may be performed under the control of a CPU 70, which controls the entire apparatus, in accordance with the process recipe of CVD processes about, e.g., the film thickness and composition of a film to be formed, stored in the memory 71 thereof in advance. In the memory 71, the relationship between the process gas flow rates and the thickness and composition of the film is also stored as control data in advance. Accordingly, the CPU 70 can control the gas supply circuits, exhaust section 24, and heater 48, based on the stored process recipe and control data.

At first, when the film-formation apparatus 12 is in a waiting state with no wafers loaded therein, the interior of the process container 14 is kept at a temperature lower than a process temperature. On the other hand, a number of wafers W, e.g. 50 wafers, are transferred into the wafer boat 28 at a normal temperature, which is then moved up from below into the process container 14. Then, the bottom port of the manifold 26 is closed by the lid 36 to airtightly seal the interior of the process container 14.

Then, the interior of the process container 14 is vacuum-exhausted and kept at a predetermined process pressure. At the same time, the power supplied to the heater 48 is increased, so that the wafer temperature is raised and stabilized at a process temperature for film-formation. Then, predetermined process gases necessary for each process step are supplied from the respective gas nozzles 52A, 54A, and 56A of the gas supply circuits 52, 54, and 56 at controlled flow rates, into the process container 14.

The process gases flow upward in the process container 14 and come into contact with the wafers W supported in the wafer boat 28, which is rotating, so as to perform a predetermined film-formation process on the wafer surfaces. The process gases thus used and gases produced by reaction are exhausted out of the apparatus through the exhaust port 16 at the top of the process container 14.

FIGS. 2A and 2B are sectional views showing sequential steps of a method for forming an Ru film, according to an embodiment of the present invention. FIG. 3 is a timing chart showing a manner of supplying gases in the film-formation method described above.

As described above, the method according to this embodiment is characterized in that the raw material gas and an assist gas (first assist gas) are supplied at different timings to be alternately supplied (see FIG. 3) so as to form a seed film (thin film) 2 of an Ru film on the surface of the semiconductor wafers W, as show in FIG. 2A. Where the raw material gas and assist gas are alternately supplied for a long time, a film having a predetermined complete thickness can be formed on the inner wall of the recess 6. However, since the film-formation rate of the seed film 2 is relatively low, this embodiment switches it to a step of forming a main film (thick film) 4 when the seed film 2 has grown to a certain thickness. In the step of forming the main film 4, the raw material gas and an assist gas (second assist gas) are simultaneously supplied to form an Ru film by CVD at a relatively large film-formation rate.

More specifically, as shown in FIG. 2A, when the wafers W are loaded into the process container 14, they have a recess 6 on the surface. The recess 6 corresponds to e.g., a contact hole. Where the Ru film is used as the upper electrode of a capacitor, there is a capacitor insulating film (high dielectric constant film) as an underlying layer.

Under the circumstances, the seed film 2 is first formed. In this embodiment, $Ru(Cp)_2$ gas is supplied from the raw material gas supply circuit 52, and ozone gas is supplied from the first assist gas supply circuit 54, both into the process container 14. At this time, as shown in FIG. 3, the raw material gas and first assist gas are intermittently supplied at different timings to deposit the seed film 2. During this film-formation process, the process container 14 is continuously vacuum-exhausted.

It should be noted here that the supply periods T1 of the raw material gas and the supply periods T2 of the assist gas are arrayed in series to each other, so that the two different gases are alternately and continuously supplied into the process container 14. Between the supply periods T1 of the raw material gas and the supply periods T2 of the assist gas, there are no purge periods of removing residual gases by supplying $N_2$ gas, or vacuum-exhaust periods of performing only vacuum-exhaust while stopping supply of all the gases.

In other words, the step of forming the seed film 2 comprises a plurality of first periods T1 and a plurality of second periods T2 performed alternately and continuously. Each first period T1 is set to supply the raw material gas into the process container 14 while stopping supply of the first assist gas. Each second period T2 is set to supply the first assist gas into the process container 14 while stopping supply of the raw material gas.

One cycle is defined by a period of time from the start of one supply period of the raw material gas to the end of one supply period of the assist gas. In this example, the film-formation process consists of five cycles. By one of the cycles as described above, an Ru film with a very small thickness, which almost corresponds to, e.g., one molecule thickness of the metal of the raw material gas, is formed by CVD on the surface of the wafers W. Five layers of this thin film are stacked to form the seed film 2. However, the number of cycles described above is not limited to this example. In this embodiment, the ozone gas functions as an oxidizing gas to thermally decompose the raw material gas stuck or adsorbed on the wafer surface, thereby depositing an Ru film.

In the step of forming the seed film 2, the process temperature is set at about 220° C., the process pressure at about 40 to 200 Pa, the flow rate of $Ru(Cp)_2$ gas at about 150 sccm, the flow rate of ozone gas at about 200 sccm, and each of the supply periods T1 and T2 at about 2 minutes. The flow rate of ozone gas corresponds to a flow rate obtained when oxygen and nitrogen are supplied into the ozonizer at 3000 sccm and 24.2 sccm, respectively, to generate ozone at 200 $g/Nm^3$ (about 10%). This condition is common to the cases described below. $Ru(Cp)_2$ or the raw material is solid at normal temperature, and has a sublimation point at about 200° C. Accordingly, the process temperature has to be higher than 200° C. With the film-formation process performed as described above, an Ru film with a thickness of several atom layers is obtained.

After the film-formation process of the seed film 2 described above is completed, a main film 4 is subsequently formed by CVD also in the same process container 14. In the step of forming the main film 4, the second assist gas, i.e., $O_2$ gas, is used in place of the first assist gas. This $O_2$ gas and the raw material gas or $Ru(Cp)_2$ gas are simultaneously supplied into the process container 14 to deposit an Ru film as the main film 4 by CVD at a relatively high film-formation rate. At this time, the main film 4 is grown and deposited, using the underlying seed film 2 as nuclei.

This film-formation process by CVD has a high film-formation rate, thereby improving the throughput, and also has high step coverage. Accordingly, the main film 4 can be efficiently formed to have an essentially uniform thickness on the inner wall of the recess 6, i.e., the bottom and side surfaces thereof, as well as the top surface of the wafers W. The second assist gas or $O_2$ gas reacts with ligands, such as $C_2H_5$, and thereby accelerates decomposition of the raw material gas.

In the step of forming the main film 4, the process temperature is set at about 260° C., the process pressure at about 100 Pa (0.75 Torr), the flow rate of $Ru(Cp)_2$ gas at about 150 sccm, and the flow rate of $O_2$ gas at about 300 sccm. It should be noted that, if $O_2$ gas is set at a flow rate 3 to 10 times that of the raw material gas, an $RuO_2$ film can be formed. The $RuO_2$ film is higher in resistivity than the Ru film, but is easier in film-formation than the Ru film. After this process, the recess 6 is filled with, e.g., an insulating oxide film.

The method according to this embodiment allows the seed film 2 and main film 4 to be formed in series in one process container 14. As a consequence, a sputtering apparatus, which the conventional method requires to form a seed film, becomes unnecessary, thereby reducing the equipment cost. Further, the step of forming the main film 4 is performed by CVD, in which the raw material gas and second assist gas are simultaneously supplied. As a consequence, the film-formation rate increases, thereby improving the throughput.

[Experiment 1]

Examination was conducted on effects obtained by arraying the supply periods of the raw material gas and the supply periods of the assist gas in series in the step of forming the seed film.

PRESENT EXAMPLE 1

In the present example 1, a film-formation process was performed by CVD under the conditions described in the embodiment (the temperature at about 220° C., the flow rate of ozone gas at about 200 sccm, etc.), using the timing chart shown in FIG. 3. As a result, it was confirmed that a seed film 2 was formed on wafers.

COMPARATIVE EXAMPLE 1

Figure 4:
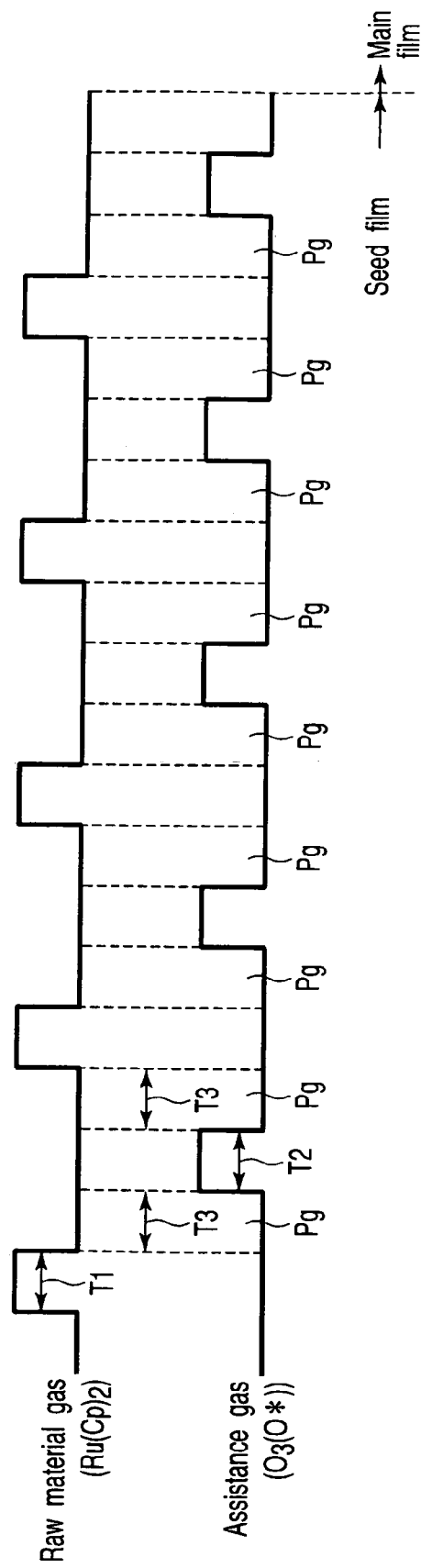
FIG. 4 is a timing chart showing a manner of supplying gases in a comparative example 1.

In the comparative example 1, the timing chart shown in FIG. 3 was modified in terms of the gas supply manner. FIG. 4 is a timing chart showing a manner of supplying gases in the comparative example 1. Specifically, in the comparative example 1, where the raw material gas and oxidizing gas are alternately supplied, purge periods are interposed between respective gas supply periods to remove residual gases. With the purge periods, the decomposing reaction of the raw material gas is suppressed in a vapor phase.

More specifically, as is understood by comparison with the timing chart shown in FIG. 3, the comparative example 1 includes purge periods Pg between the supply periods T1 of the raw material gas or $Ru(Cp)_2$ gas, and the supply periods T2 of the assist gas (oxidizing gas). In the purge periods Pg, the process container 14 is vacuum-exhausted while being supplied with an inactive gas, such as $N_2$ gas, to remove residual gases therefrom. The length T3 of each of the purge periods Pg is about 2 minutes.

The timing chart shown in FIG. 4 was actually used to perform an experiment. In this experiment, the other process conditions were set the same as those explained with reference to FIG. 3, and immediately after this process, a CVD film-formation process the same as that described above was performed. As a result, formation of a seed film was essentially not observed on the wafer surface. Also, it was observed that an Ru film was barely deposited on the wafer surface by the CVD film-formation process performed thereafter. A similar experiment was also performed on a case where, in place of the purge periods Pg or in addition to the purge periods Pg, vacuum-exhaust periods of performing only vacuum-exhaust while stopping supply of all the gases were used to remove residual gases. As a result, it was observed that an Ru film was barely deposited, as in the case described above.

The reaction process at this time is thought to proceed as follows. FIGS. 5A to 5D are views schematically showing the reaction process of the comparative example 1. FIGS. 6A to 6F are views schematically showing the reaction process of the present example 1.

Figure 5A:
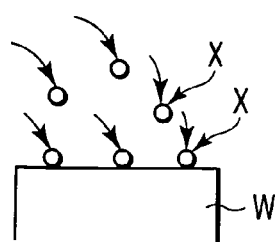
FIGS. 5A to 5D are views schematically showing the reaction process of the comparative example 1.
Figure 5B:
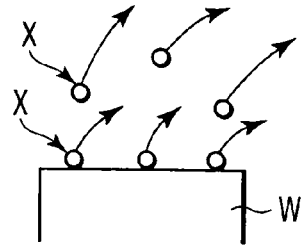
Figure 5C:
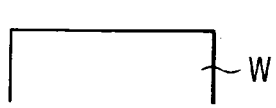

In the case of the comparative example 1, the raw material gas is supplied into the process container, and molecules X of the raw material gas are stuck or adsorbed on the surface of each wafer W (FIG. 5A). Then, during the purge period or vacuum-exhaust period, not only molecules X of the raw material gas in the atmosphere are removed, but also molecules X of the raw material gas adsorbed on the surface of the wafer W are desorbed therefrom (FIG. 5B). This results in a state where nothing is adsorbed on the surface of the wafer W (FIG. 5C). It is thought that this occurs because $Ru(Cp)_2$ gas used as the raw material gas has low surface adsorptivity.

Figure 5D:
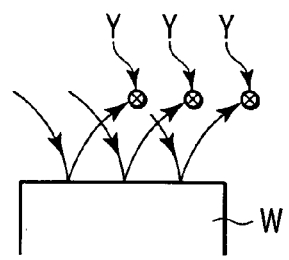

Under such a state, even if ozone gas is supplied, molecules Y of the ozone gas cannot bring about generation of Ru atoms, because no molecules X of the raw material gas are present on the wafer surface (FIG. 5D). As a consequence, even if the operations described above are repeated, no seed film is deposited on the surface of the wafer W.

Figure 6A:
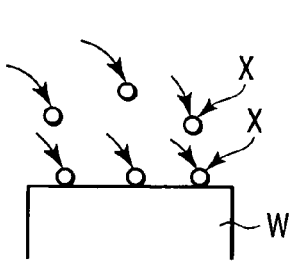
FIGS. 6A to 6F are views schematically showing the reaction process of a present example 1.
Figure 6B:
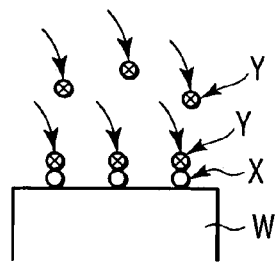
Figure 6C:
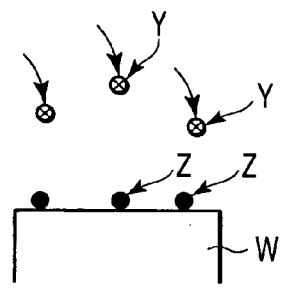

On the other hand, in the case of the present example 1, the raw material gas is supplied into the process container, and molecules X of the raw material gas are stuck or adsorbed on the surface of each wafer W (FIG. 6A). Subsequently to this, ozone gas used as an oxidizing gas is supplied without any purge period or vacuum-exhaust period interposed therebetween (FIG. 6B). Molecules Y of the ozone gas act on and thermally decompose molecules X of the raw material gas adsorbed on the surface of the wafer W, thereby depositing Ru atoms Z (FIG. 6C).

Figure 6D:
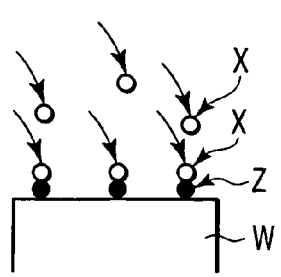
Figure 6E:
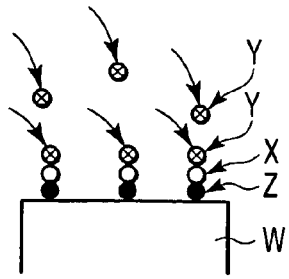
Figure 6F:
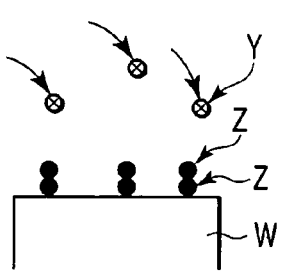

Then, the raw material gas is supplied again into the process container, and molecules X of the raw material gas are stuck or adsorbed on the Ru atoms Z on the wafer surface (FIG. 6D). Subsequently to this, ozone gas used as an oxidizing gas is supplied (FIG. 6E). Molecules Y of the ozone gas act on and thermally decompose molecules X of the raw material gas adsorbed on the surface of the wafer W, thereby depositing a second layer of Ru atoms Z (FIG. 6F). Subsequently, the same operations are repeated, so that the seed film 2 is deposited to have a predetermined thickness.

[Experiment 2]

Next, examination was conducted on the step of forming the seed film 2 in terms of its dependency on the flow rate and temperature of ozone gas, in the method according to the embodiment described above.

PRESENT EXAMPLE 2

As described above, in the present example 1, the process temperature was set at about 220° C., and the flow rate of ozone gas at about 200 sccm, to form the seed film 2 shown in FIG. 2. On the other hand, in this present example 2, the process temperature was set at about 220° C., i.e., the same as that described above, and the flow rate of ozone gas at about 300 sccm, i.e., 1.5 times that described above. The other process conditions were set the same as those of the present example 1 to perform a CVD film-formation process.

As a result, in the present example 2, film-formation of an Ru film was observed to a small extent, in which a total film thickness was far smaller than that of the present example 1, down to e.g., about 10 to 20% thereof. Accordingly, it is though that, where the process temperature is set at about 220° C., the flow rate of the ozone gas has a upper limit near 300 sccm. If the flow rate is larger than this, the seed film is barely formed, and film-formation cannot be performed by CVD. This is thought to occur because an Ru film stuck or adsorbed is etched where the concentration or flow rate of ozone gas is high.

COMPARATIVE EXAMPLE 2

In the comparative example 2, the flow rate of ozone gas was set at about 300 sccm, i.e., the same as that of the present example 2, and the process temperature was set at about 260° C., i.e., higher than that of the present example 2. The other process conditions were set the same as those of the present example 1 to perform a CVD film-formation process.

As a result, the comparative example 2 brought about large particles, which were visually observable. Further, no seed film was formed, and thus film-formation could not be performed by CVD. Accordingly, it was confirmed that 260° C. was too high as the process temperature. This is thought to occur occurred because $Ru(Cp)_2$ actively reacted in a vapor phase due to a high temperature, and produced abnormally decomposed substances, which were then deposited on each wafer. Further, it is thought to be that the etching action of ozone gas, as explained in the present example 2, was enhanced and become dominant due to a temperature as high as 260° C.

[Experiment 3]

Next, examination was conducted on the step of forming the seed film 2 in terms of its dependency on the type, flow rate, and temperature of the first assist gas, in a method according to the present invention. In the embodiment described above, ozone (oxidizing gas) is used as the first assist gas. Alternately, $O_2$ gas (oxidizing gas) may be used as the first assist gas.

COMPARATIVE EXAMPLE 3

As described above, in the present example 1, the process temperature was set at about 220° C., and the flow rate of ozone gas at about 200 sccm, to form the seed film 2 shown in FIG. 2. On the other hand, in this comparative example 3, the process temperature was set at about 220° C., i.e., the same as that described above, and $O_2$ gas was used as the oxidizing gas (assist gas) in place of ozone. The flow rate Of $O_2$ gas was set at about 300 sccm, i.e., 1.5 times that described above. The other process conditions were set the same as those of the present example 1 to perform a CVD film-formation process.

As a result, the comparative example 3 brought about large particles, which were visually observable, although some seed film was formed. Accordingly, this example was ascertained to be useless. It is thought such that, since $O_2$ gas not activated was used at a process temperature of about 220° C., which was slightly higher than the sublimation point of the raw material, the raw material gas was solidified again and produced particles.

PRESENT EXAMPLE 3

In the present example 3, the flow rate of $O_2$ gas used as an oxidizing gas was set at about 300 sccm, i.e., the same as that of the comparative example 3, and the process temperature was set at about 260° C., i.e., higher than that of the comparative example 3. The other process conditions were set the same as those of the present example 1 to perform a CVD film-formation process.

As a result, formation of both of the seed film and main film was observed in the present example 3. Further, although some particles are produced, their size was far smaller than that of the comparative example 3. Accordingly, this example was ascertained to be usable.

PRESENT EXAMPLE 4

In the present example 4, the process temperature was set at about 260° C., i.e., the same as that of the comparative example 3, and the flow rate of $O_2$ gas used as an oxidizing gas was set at about 200 sccm, i.e., lower than that of the comparative example 3. The other process conditions were set the same as is those of the present example 1 to perform a CVD film-formation process.

As a result, formation of both of the seed film and main film was observed in the present example 4. Further, although some particles are produced, their size was still smaller than that of the present example 3. Accordingly, this example was ascertained to be usable. As a consequence, it has been found that, where $O_2$ gas is used as an oxidizing gas and the process temperature is set at 260° C. or more in the step of forming the seed film, the main film (thick film) is formed to have relatively good quality.

It should be noted that the present invention is widely applicable to a process in which a raw material gas has low surface adsorptivity and cannot at all cause formation of a seed film, which functions as a first foothold on an underlying layer. In this case, conventionally, a seed film is first formed on the underlying layer by sputtering, and a main film is then formed on the seed film by CVD. The present invention can provide such a process with some improvement in general.

In light of this, the present invention can be modified, as follows. Specifically, the embodiment described above employs $Ru(Cp)_2$ gas as the raw material gas. Alternatively, bisethylcyclopentadienyl ruthenium $(Ru(EtCp)_2$: $Ru(C_2H_5C_5H_4)_2)$ may be used as the raw material gas.

Further, the embodiment described above is arranged to deposit an Ru film as either of the seed film (thin film) and main film (thick film). Alternatively, the present invention may be applied to a case where a film of a metal, such as Ti, Ta, W (tungsten), Hf, or Al, or a compound of such a metal (including oxide, nitride, etc.) is formed. Also, the present invention may be applied to a case where a PZT film (an oxide film of Pb, Zr, and Ti), or a BST film (an oxide film of Ba, Sr, and Ti) is deposited.

In these cases, a metal-containing material gas or organic metal material gas may be used as a raw material gas. For example, where a Ta film is formed, PET (pentoethoxy tantalum) is used as a raw material gas, and $H_2O$ is used as an assist gas. Where a BST film is formed, BST materials are used as raw material gases, and $H_2O$ is used as an assist gas. Where a PZT film is formed, PZT materials are used as raw material gases, and $H_2O$ is used as an assist gas. In these cases, $H_2O$ used as an assist gas functions as a gas for decomposing and oxidizing the raw material.

Where a TiN film is formed, $TiCl_4$ gas is used as a raw material gas, and $NH_3$ gas is used as an assist gas. In this case, $NH_3$ gas used as an assist gas functions as a deoxidizing gas.

Further, in the embodiment described above, $O_2$ gas is activated to generate ozone that is mainly used as a first assist gas for reaction. Alternatively, $H_2$ gas and $O_2$ gas may be used as assist gases, and caused to react with each other within a low temperature and vacuum pressure atmosphere, thereby generating oxygen radicals and hydroxyl group radicals (for example, see Jpn. Pat. Appln. KOKAI Publication No. 2002-176052). Alternatively, solely oxygen radicals may be used, wherein such oxygen radicals can be generated by exposing $O_2$ gas to a plasma atmosphere. In this respect, Jpn. Pat. Appln. KOKAI Publication Nos. 5-251391 and 2002-280378 disclose a technique for generating oxygen radicals, using plasma.

Furthermore, in the embodiment described above, the film-formation apparatus is exemplified by a vertical film-formation apparatus of the batch type with a single-tube reaction container. Alternatively, the present invention may be applied to a vertical film-formation apparatus of the batch type with a double-tube reaction container, or to a film-formation apparatus of the single-substrate type for processing wafers one by one. A film to be formed is not limited to a capacitor electrode, and the present invention may be applied to a gate electrode or barrier layer. A target substrate is not limited to a semiconductor wafer, and the present invention may be applied to a LCD substrate or glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for forming a film of ruthenium or ruthenium oxide, comprising:

supplying a raw material gas comprising $Ru(C_5H_5)_2$ or $Ru(C_2H_5C_5H_4)_2$ and a first assist gas comprising ozone or oxygen into a process container, which accommodates a target substrate having an underlying layer on a surface, thereby forming a seed film on the underlying layer by CVD; and supplying the raw material gas and a second assist gas comprising an oxidizing gas to react with the raw material gas into the process container, thereby forming a main film on the seed film by CVD, wherein forming the seed film comprises a plurality of first periods and a plurality of second periods performed alternately and continuously, each first period is set to supply the raw material gas into the process container while stopping supply of the first assist gas, and each second period is set to supply the first assist gas into the process container while stopping supply of the raw material gas, wherein the first and second periods are performed while vacuum-exhausting the process container, and wherein the plurality of first periods and the plurality of second periods are performed alternately and continuously such that, between the plurality of first periods and the plurality of second periods, there are no purge periods of removing residual gases by supplying a purge gas into the process container, or vacuum-exhaust periods of performing vacuum-exhaust of the process container while stopping supply of all gases.

2. The method according to claim 1, wherein forming the main film comprises simultaneously supplying the raw material gas and the second assist gas into the process container.

3. The method according to claim 1, wherein the first and second assist gases are different gases.

4. The method according to claim 1, wherein the first and second assist gases are essentially the same gas.

5. The method according to claim 1, wherein forming the main film comprises alternately supplying the raw material gas and the second assist gas into the process container.

6. The method according to claim 1, wherein the first assist gas is supplied into the process container while having been activated.

7. The method according to claim 6, wherein the first assist gas is activated to be a gas containing at least one of ozone and oxygen radicals.

8. The method according to claim 1, wherein the second assist gas is oxygen.

9. The method according to claim 8, wherein the first assist gas is ozone, and the second assist gas is oxygen.

10. The method according to claim 9, wherein forming the seed film is performed at a process temperature lower than that a process temperature for forming the main film.

11. The method according to claim 1, wherein forming the seed film is performed at a process pressure of 40 to 200 Pa.

12. The method according to claim 1, wherein, in order to define the first and second periods, each of the raw material gas and the first assist gas is supplied pulse-wise with rectangular pulses such that the rectangular pulses of the raw material gas have rising edges and falling edges coincident with falling edges and rising edges of the rectangular pulses of the first assist gas, respectively.

13. The method according to claim 1, wherein there are no purge periods of removing residual gases by supplying a purge gas into the process container and there are no vacuum-exhausting periods of the process container while stopping supply of all gases.

* * * * *